(12) United States Patent
Ogawa et al.

(10) Patent No.: US 9,053,838 B2
(45) Date of Patent: Jun. 9, 2015

(54) CONDUCTIVE RUBBER COMPONENT AND METHOD FOR MOUNTING SAME

(75) Inventors: Toshiki Ogawa, Toyota (JP); Masakazu Koizumi, Toyota (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 191 days.

(21) Appl. No.: 13/809,772

(22) PCT Filed: May 18, 2011

(86) PCT No.: PCT/JP2011/061425
§ 371 (c)(1),
(2), (4) Date: Jan. 11, 2013

(87) PCT Pub. No.: WO2012/026165
PCT Pub. Date: Mar. 1, 2012

(65) Prior Publication Data
US 2013/0105198 A1 May 2, 2013

(30) Foreign Application Priority Data
Aug. 27, 2010 (JP) .................................. 2010-191129

(51) Int. Cl.
| H01B 1/12 | (2006.01) |
| H01R 12/57 | (2011.01) |
| H01R 13/24 | (2006.01) |
| H05K 3/32 | (2006.01) |
| H01R 43/00 | (2006.01) |
| H01R 43/02 | (2006.01) |
| H05K 3/34 | (2006.01) |

(52) U.S. Cl.
CPC .............. *H01B 1/12* (2013.01); *Y10T 29/49149* (2015.01); *H01R 12/57* (2013.01); *H01R 13/2414* (2013.01); *H05K 3/341* (2013.01); *H05K 3/32* (2013.01); *H05K 2201/0314* (2013.01); *H05K 2201/0367* (2013.01); *H05K 2201/1031* (2013.01); *H05K 2201/10962* (2013.01); *H01R 43/007* (2013.01); *H01R 43/0263* (2013.01)

(58) Field of Classification Search
CPC ........... H05K 3/341; H05K 2201/0367; H01R 13/2414; Y10T 428/24174
USPC ....................................... 428/119, 98; 29/842
See application file for complete search history.

(56) References Cited

U.S. PATENT DOCUMENTS

| 6,307,946 | B1 | 10/2001 | Fujimoto et al. |
| 2004/0203268 | A1 | 10/2004 | Nishizawa |
| 2010/0000781 | A1* | 1/2010 | Tanaka et al. ................. 174/351 |
| 2010/0323767 | A1 | 12/2010 | Tanaka et al. |

FOREIGN PATENT DOCUMENTS

| CN | 1320554 C | 6/2007 |
| EP | 2073619 | 6/2009 |

(Continued)

OTHER PUBLICATIONS

Chinese Office Action, Jan. 27, 2015; Chinese Application No. 201180040669.8 (9 pages).

*Primary Examiner* — Brent O'Hern
(74) *Attorney, Agent, or Firm* — Hamre, Schumann, Mueller & Larson, P.C.

(57) ABSTRACT

A conductive rubber component (10) of the present invention includes a metal coating (2) formed on at least one surface located perpendicular to a compression direction of a conductive rubber single body (1) by atomic and/or molecular deposition, and can be surface mounted and soldered. In a method for mounting a conductive rubber component (10) of the present invention, the conductive rubber component (10) is surface mounted on a wiring layer (8) on a printed wiring board (9) and is fixed by a solder layer (7) thereto and thereby is incorporated to electrically connect the printed circuit board (9) and an electronic component (11) to each other. Thus, a conductive rubber component and a method for mounting same are provided, wherein the conductive rubber component is used as an electrical contact of an electronic component compatible with the surface mount technology (SMT), the conductive rubber component does not cause any damage to the electrode surface of the electronic component even when the body of an electronic device in which it is mounted is distorted or warped, it has lower resistance and excellent chemical stability and can be used for SMT.

17 Claims, 5 Drawing Sheets

FOREIGN PATENT DOCUMENTS

| | | |
|---|---|---|
| EP | 2325948 | 5/2011 |
| JP | 61-82609 | 4/1986 |
| JP | 11-75279 | 3/1999 |
| JP | 2004-259488 | 9/2004 |
| JP | 2005-116406 | 4/2005 |
| JP | 2008-123788 | 5/2008 |
| JP | 4231899 B | 3/2009 |
| JP | 4472783 B | 6/2010 |
| WO | WO 2010/032521 | 3/2010 |

* cited by examiner

FIG. 6B ued to operate on this page...

CONDUCTIVE RUBBER COMPONENT AND METHOD FOR MOUNTING SAME

TECHNICAL FIELD

The present invention relates to a conductive rubber component that can be solder mounted by surface mount technology (SMT). Particularly, the present invention relates to a conductive rubber component with a metal coating for electrically connecting an electronic component and a printed circuit board, and a method for mounting same.

BACKGROUND ART

Conventionally, in electronic devices that are required to be thinner, such as calculators, portable telephones, and portable game devices, conductive rubber has been used as connectors between contacts of electronic components such as liquid crystal displays, microphones, and speakers and those of printed circuit boards. In this case, a holder for fixing the conductive rubber is prepared and the conductive rubber is inserted thereinto manually and is compressed to be in contact with the electronic components and the printed circuit board therebetween. Thus electrical contacts are obtained.

Thereafter, with an improvement in technology for mounting electronic components, solder mounting by SMT aimed to reduce assembly time has become the mainstream. Accordingly, for example, metal spring contacts compatible with SMT have been used often, but devices that are operated by hand, such as calculators, portable telephones, and portable game devices, have bodies that tend to be distorted or warped by force of people's hands. Inside a body, therefore, the contact part of the metal spring slides on an electrode of the electronic component that is in contact therewith, and thereby the treated surface of the electrode, for example, gold plating, is worn away, resulting in loss of electrical connection in the worst case, which has been a problem. With these situations, there have been demands for components that do not cause any damage to electrodes of electronic components inside the devices that are operated by hand, such as, calculators, portable telephones, and portable game devices, even when the bodies thereof are distorted or warped. Examples of components that can be used to achieve the object include a metal-integral conductive rubber component (Patent Document 1) and a conductive rubber (Patent Document 2) that can be solder mounted by SMT.

In the metal-integral conductive rubber component as described in Patent Document 1, a conductive rubber layer and an insulating rubber layer are laminated alternately and parallel to each other, the boundaries between the conductive rubber layer and the insulating rubber layer are integrated by cross-linking the conductive rubber layer and the insulating rubber layer, and a metal sheet is joined to at least one of the surfaces perpendicular to the electrical conduction direction of the laminate through a conductive adhesive layer made of a conductive rubber to integrate the metal sheet with the laminate. In this case, it is necessary to use a conductive adhesive and a metal foil that are relatively expensive. Moreover, the material of the conductive adhesive is different in material properties from the laminate of the conductive rubber layer and the insulating rubber layer. Particularly, there has been a problem in poor compression set, resulting in a problem of electrical connection reliability in the case of using it as a conductive rubber component.

The conductive rubber component as described in Patent Document 2 does not include such a conductive adhesive layer as that of Patent Document 1 but has a metal coating produced by sputtering to be integrated, which prevents the compression set from posing a problem. However, due to the material constitution of the laminate of the conductive rubber and the insulating rubber, it is not suitable for electrical connections that require lower resistance, which has been a problem. Furthermore, the material (any metal selected from gold, platinum, silver, copper, nickel, titanium, aluminum, and palladium or an alloy thereof) specified for the metal coating in the sputtering method to be employed tends to undergo chemical alteration due to the ionization tendency depending on the material. Accordingly, there is a problem of corrosion in a poor environment. There are some materials that do not tend to undergo chemical alteration, such as gold and platinum. However, when the metal coating is formed of such a material alone to have a thickness that allows it to be soldered, the material cost becomes expensive, which has been a problem. Moreover, since the object to be coated is a conductive rubber, it is difficult to increase the deposition rate. Therefore, when the time required for sputtering is taken into consideration, the cost for the coating process becomes expensive, which also has been a problem.

PRIOR ART DOCUMENTS

Patent Documents

Patent Document 1: JP 4231899 B
Patent Document 2: JP 4472783 B

DISCLOSURE OF INVENTION

Problem to be Solved by the Invention

The present invention provides a conductive rubber component and a method for mounting same. The conductive rubber component is used as an electrical contact for solder mounting an electronic component of, for example, a calculator, portable telephone, and portable game device, by SMT. The conductive rubber component does not cause any damage to the electrode surface of the electronic component even when the body of such an electronic device is distorted or warped. Furthermore, it has electrically lower resistance and excellent chemical stability, and can be used for solder mounting by the surface mount technology.

Means for Solving Problem

A conductive rubber component of the present invention includes a metal coating formed on at least one surface located perpendicular to a compression direction of a conductive rubber single body by atomic and/or molecular deposition and can be surface mounted and soldered.

A method of mounting a conductive rubber component of the present invention is a method of mounting the above-mentioned conductive rubber component, wherein the conductive rubber component is surface mounted on a printed circuit board and is fixed by solder to be incorporated to connect the printed circuit board and an electronic component to each other electrically.

Effects of the Invention

The present invention is an electrical contact that can be solder mounted on a printed circuit board by SMT and is a conductive elastic body that does not damage the electrode surface of an electronic component even when the body of an electronic device into which the printed circuit board is incorporated is distorted or warped. Furthermore, it has a lower resistance and its production cost is low. This conductive rubber component with a metal coating can be solder mounted by SMT. For instance, it can be solder mounted on a printed circuit board inside a portable telephone by SMT and is suitable for an electrical connection with an electronic component.

DESCRIPTION OF THE INVENTION

The conductive rubber component of the present invention includes a metal coating formed directly on at least one surface located perpendicular to the compression direction of a conductive rubber single body by atomic and/or molecular deposition and can be surface mounted and soldered. The conductive rubber component can be supplied by an adsorber and the metal coating is used for solder mounting.

A preferred conductive rubber component with a metal coating of the present invention uses an electrically conductive elastic rubber as a base material and includes a metal coating that can be solder mounted by SMT and that is formed on at least one surface located perpendicular to the compression direction by atomic and/or molecular deposition. The metal coating is formed by sputtering and is made of any metal selected from gold, platinum, silver, titanium, aluminum, palladium, copper, and nickel or an alloy thereof and is formed of a single layer or two or more layers.

In the case of a two-layered metal coating, it is preferable that a relatively inexpensive material, for example, nickel or a nickel-copper alloy, be deposited directly on the conductive rubber single body to form a first layer and then a gold deposition layer be provided as an outermost layer.

The conductive rubber component with a metal coating that can be solder mounted by SMT of the present invention includes a metal coating formed on at least one surface located perpendicular to the compression direction by atomic and/or molecular deposition. The electrical resistance of the conductive rubber single body is preferably between $10^{-5}$ $\Omega \cdot cm$ and $10\, k\Omega \cdot cm$ in terms of volume resistance. Since the conductive rubber is a single body, the electrical resistance value can be decreased and the cost can be reduced. In this case, the "single body" means a single layer.

The material for the conductive rubber single body may be selected from an organic synthetic rubber such as a butadiene polymer (BR: classification by ASTM D1419, this also applies to the following abbreviations), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM). A preferred example is the alkylsiloxane condensation product that is commercially available as a silicone rubber compound or liquid silicone, and any material may be used as long as it is cured into a rubber elastic body. Particularly preferable materials are the alkylsiloxane condensation product and silicone rubber that can be mixed with a conductive powder to be easily provided with conductivity The silicone rubber is organopolysiloxane that has at least two aliphatic unsaturated groups and is expressed as a chemical formula $R_n SiO_{(4-n)/2}$ (where R represents the same or different type of unsubstituted or substituted monovalent hydrocarbon group (with a carbon number of 1), and n is a positive number of 1.98 to 2.02. The same applies to the following).

A material for a conductive filler that is mixed with the silicone rubber to impart conductivity is preferably one obtained by processing carbon, copper, a copper alloy, nickel, titanium, gold, silver, or an alloy thereof into particles or by forming a metal conductive layer on the surface of a core material such as glass or resin by, for example, plating or vapor deposition. A particularly preferable material is a silver coated glass powder with an average particle size of $1.0\, \mu m$ to $50\, \mu m$. This average particle size can be determined using, for example, a laser diffraction particle size analyzer LA920 (manufactured by Horiba, Ltd.) or SALD2100 (manufactured by Shimadzu Corporation). The conductive filler is added preferably in an amount of 60 to 600 mass % per 100 mass % of rubber, more preferably in an amount of 200 to 400 mass %.

A clay-like conductive rubber compound containing the silicone rubber and the conductive filler mixed therein may be cured by any curing mechanism of an addition reaction that uses as a curing agent either an organic peroxide or organohydrogenpolysiloxane and a platinum catalyst. For the curing mechanism, a method to be selected is one that ultimately allows the conductive rubber compound to be thermally cured and also to have an electrically stable volume resistivity. Preferably, the conductive rubber compound is cured by a radical reaction using 2,5-dimethyl-2,5-di(tert-butylperoxy) hexane as a curing agent.

In the present invention, a metal coating is applied to at least one surface located perpendicular to the compression direction of the conductive rubber single body. The metal coating is formed by atomic or molecular deposition. The metal atoms or metal molecules may be deposited by, for example, a sputtering, vapor deposition, ion plating, or plating method. In the sputtering method, for example, plasma is produced by applying a voltage of several hundred V to several kV between a substrate or a vacuum chamber (ground) and a target at 10 to $10^{-4}$ Pa, and then the metal atoms and/or metal molecules are sputtered and deposited on the substrate that is located near the target. In this case, the substrate is the conductive rubber single body. The sputtering method is suitable for the present invention. The vapor deposition, ion plating, and plating methods are well known in general, and any known methods can be used.

The material for the metal coating is any metal selected from gold, platinum, silver, titanium, aluminum, palladium, copper, and nickel or an alloy thereof. The metal coating is formed of a single layer or two or more layers. Such a material is applied to at least one surface of the conductive rubber single body, preferably using the sputtering method. The thickness of the metal coating of a single layer or two or more layers is preferably 0.05 μm to 4 μm, and more preferably 0.8 μm to 1.2 μm.

Preferably, the outermost layer of the metal coating is made of gold and the thickness of the gold coating is 0.005 μm to 1 μm.

The conductive rubber component of the present invention can be used for electrically connecting, for example, a printed circuit board of a portable telephone and an electrode part of an electronic component to each other.

Figure 1A:
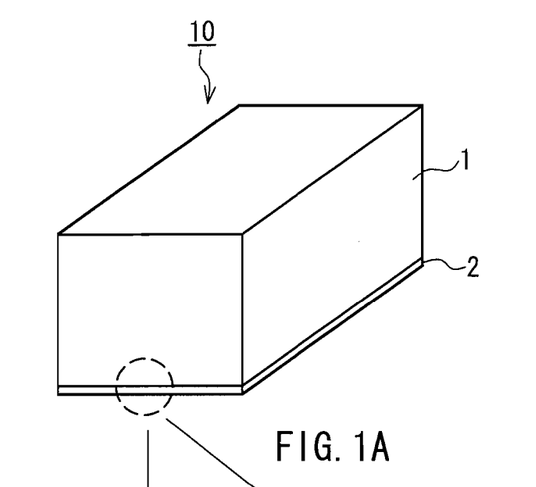
FIG. 1A is a perspective view showing a conductive rubber component according to an embodiment of the present invention.
Figure 1B:
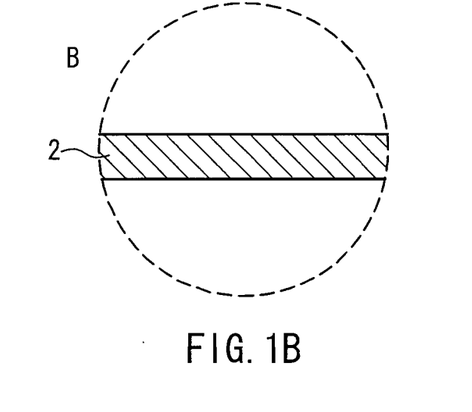
FIG. 1B is a perspective view showing a part of a single layer metal coating of the same.
Figure 1C:
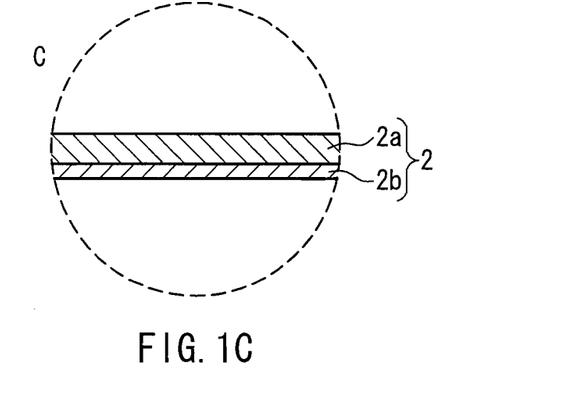
FIG. 1C is a perspective view showing a part of a two layer metal coating.

The following descriptions are made with reference to the drawings. FIG. 1A is a perspective view showing a conductive rubber component according to an embodiment of the present invention. The conductive rubber component 10 includes a metal coating 2 applied integrally to at least one surface located perpendicular to the compression direction of a conductive rubber single body 1. The conductive rubber single body 1 may have any shape as long as it has a shape with an upper surface and a lower surface that are parallel to each other, such as a cube, a rectangular, or one with a trapezoidal section. The metal coating 2 may be a single layer as shown in FIG. 1B or may be formed of two layers including an inner metal coating 2a and an outer metal coating 2b as shown in FIG. 1C. The conductive rubber component 10 is electrically connected vertically. In the case where the conductive rubber component 10 is rectangular, the size thereof is preferably in the range of 0.4×0.6×0.3 mm to 5.0×10.0×3.0 mm in length by width by height (vertical).

Figure 2A:
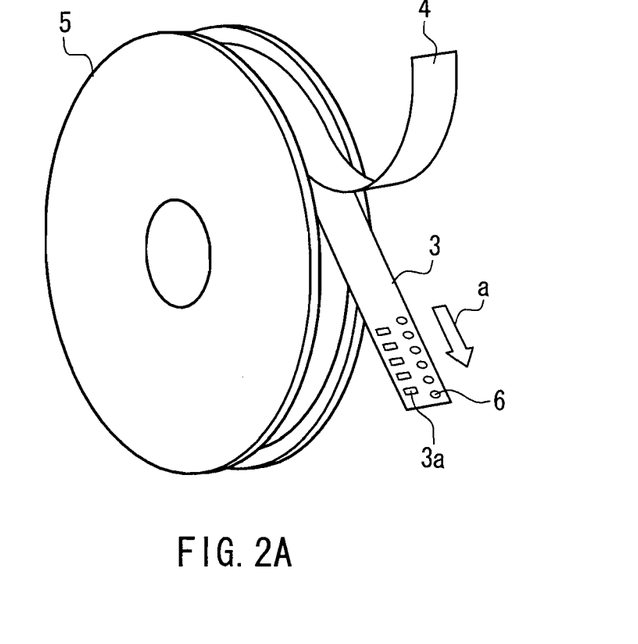
FIG. 2A is a perspective view showing a taping for mounting a conductive rubber component according to an embodiment of the present invention.
Figure 2B:
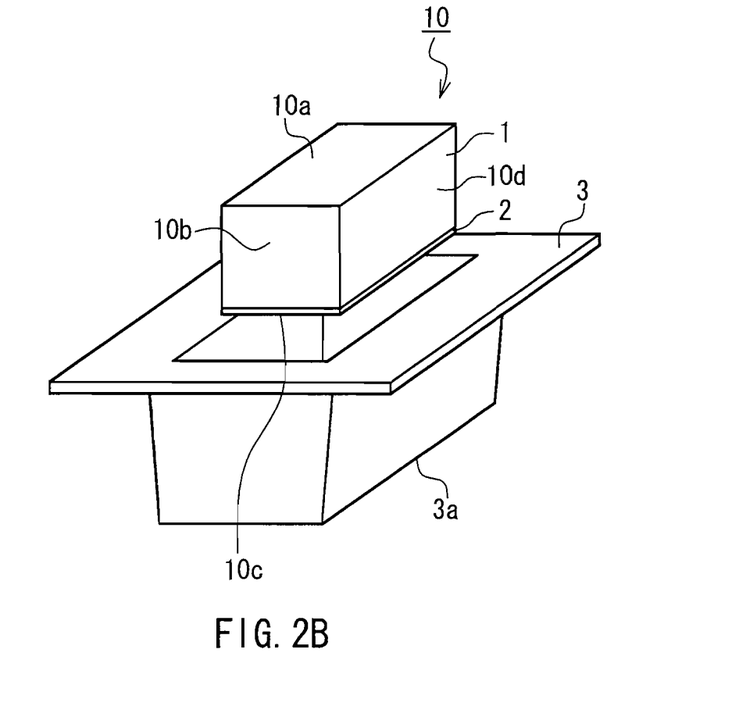
FIG. 2B is a diagram for explaining how to accommodate the conductive rubber component in the carrier tape.

FIG. 2A is a perspective view showing a taping for mounting a conductive rubber component according to an embodiment of the present invention. As shown in FIG. 2B, the conductive rubber component 10 is accommodated in a carrier tape 3 wound around a reel 5. A cover tape 4 is peeled off and thereby the conductive rubber component 10 is drawn out in the direction indicated with an arrow a to be supplied to an adsorber for surface mounting. The conductive rubber component 10 is accommodated in a pocket 3a of the carrier tape 3 while being placed, with the upper surface 10a being of the conductive rubber single body 1, the lower surface 10c being of the metal coating 2, and the conductive rubber single body 1 being located on the upper side of the side surfaces 10b, 10d and the metal coating 2 being located on the lower side of the side surfaces 10b, 10d. The upper surface 10a is adsorbed by a suction nozzle of the adsorber and the conductive rubber component 10 is incorporated into an electrical device. Furthermore, the metal coating 2 is used for solder mounting. Numeral 6 indicates a feed hole.

Figure 3A:
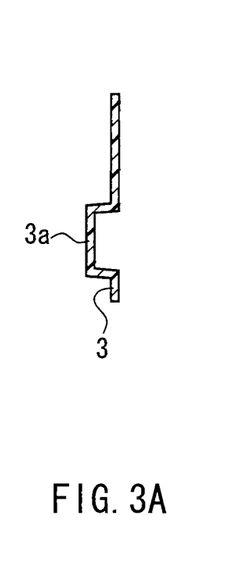
FIG. 3A is a cross-sectional view of the carrier tape taken on line I-I shown in FIG. 3B.
Figure 3B:
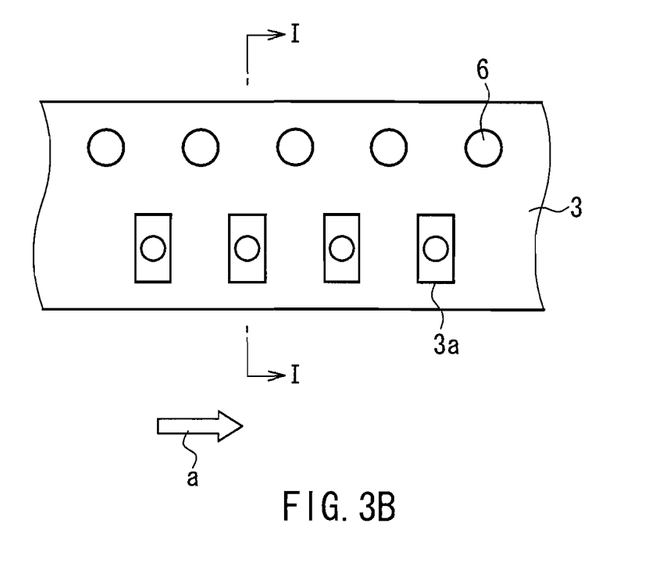
FIG. 3B is a plan view of the carrier tape.

FIG. 3B is a plan view of the carrier tape and FIG. 3A is a cross-sectional view of the carrier tape taken on line I-I shown in FIG. 3B. The carrier tape 3 has pockets 3a formed therein, and conductive rubber components are accommodated therein. The carrier tape 3 also has feed holes 6 formed therein, which allow a predetermined number of conductive rubber components to be supplied to the adsorber in a predetermined time.

Figure 4:
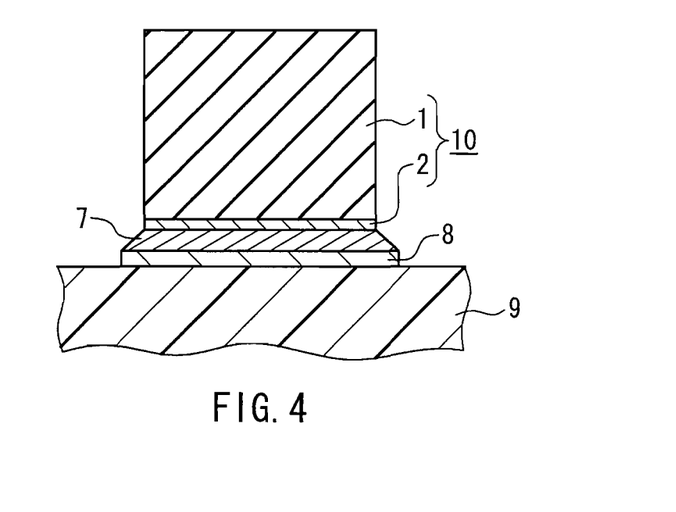
FIG. 4 is a mounted view of a conductive rubber component according to an embodiment of the present invention.

FIG. 4 is a mounted view of a conductive rubber component according to an embodiment of the present invention. The conductive rubber component 10 is placed on a wiring layer 8 located on the surface of a printed circuit board 9, with the metal coating 2 facing toward the wiring layer 8, and the metal coating 2 and the wiring layer 8 are fixed together with a solder layer 7 to be electrically conductive at the same time.

Figure 5:
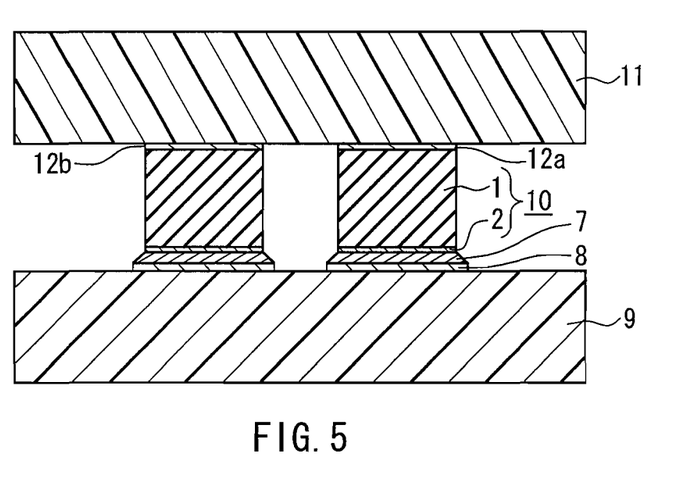
FIG. 5 is a mounted view of a conductive rubber component according to another embodiment of the present invention.

An electronic component 11 is placed on the conductive rubber component 10 as shown in FIG. 5 in such a manner that the electrodes 12a, 12b located on the surface of the electronic component have a planar connection with the conductive rubber component 10. In the resultant product, since the electrodes 12a, 12b have a planar connection with the conductive rubber single body 1, the electrodes will not be damaged even when the electronic component vibrates. It also is preferable that the printed circuit board 9 and the electronic component 11 shown in FIG. 5 be mounted, with the conductive rubber component 10 being compressed by 10 to 50%. This allows the planar connection to be stronger and more stable.

Figure 6A:
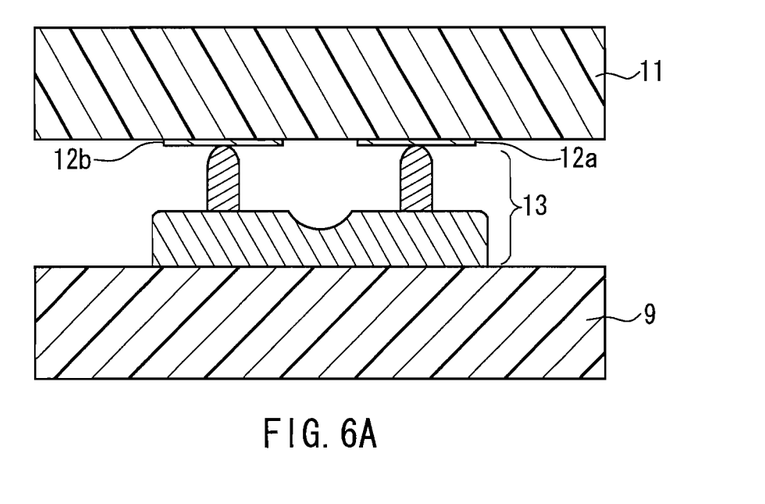
FIGS. 6A and 6B are mounted views of conventional examples.
Figure 6B:
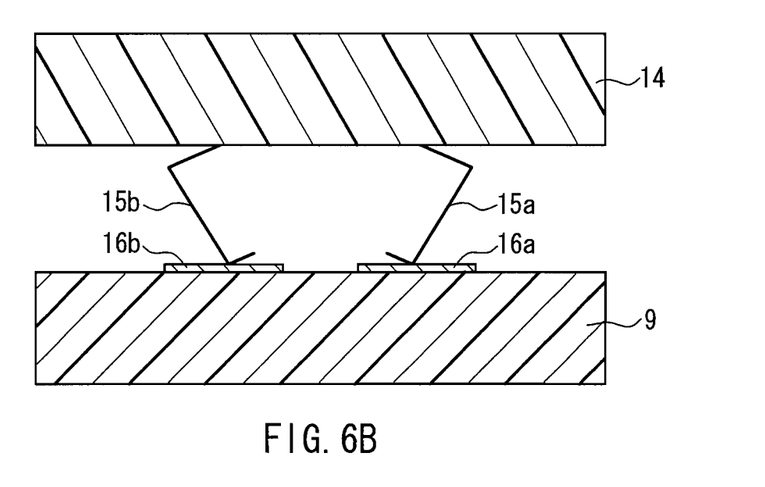

On the other hand, in the conventional mounting method shown in FIG. 6A, a printed circuit board 9 and the electronic component 11 are connected to each other with a pin connector 13 having small points. Therefore, vibration of the electronic component tends to cause damage to electrodes where the points of the connector 13 contact the electrodes 12a, 12b of the electronic component 11. Furthermore, in the mounting method of another conventional example shown in FIG. 6B, a printed circuit board 9 and an electronic component 14 are connected with spring contacts 15a, 15b. Therefore, vibration of the electronic component tends to cause damage to electrodes where the spring contacts 15a, 15b contact electrodes 16a, 16b of the printed circuit board.

As described above, the conductive rubber component of the present invention serves as an electrical contact that can be mounted on a printed circuit board by SMT, and is a conductive elastic body that does not damage the electrode surfaces of the electronic component even when the body of the electronic device into which the printed circuit board is incorporated is distorted or warped. The conductive rubber with a metal coating has made it possible to reduce the material cost and the time required for deposition by employing, for a large part of the metal coating, an electrode material that has excellent deposition properties with respect to a silicone rubber and that can increase the deposition rate. Furthermore, it uses an electrode material that has a corrosion concern from the viewpoint of ionization tendency. However, with a gold layer provided as the surface layer, it shows excellent storage properties over a long period of time of storage within the carrier tape. This conductive rubber with a metal coating is solder mounted, for example, on a printed circuit board in a portable telephone by SMT and is suitable for an electrical connection with an electronic component.

EXAMPLE

Hereinafter, the present invention is described in further detail using examples. The present invention, however, is not limited to the following examples.

In the following examples and comparative examples, various properties were determined as described below.

(1) Average Particle Size

The average particle size was determined using, for example, a laser diffraction particle size analyzer LA920 (manufactured by Horiba, Ltd.) or SALD2100 (manufactured by Shimadzu Corporation). It shows the d50 average particle size obtained by a laser diffraction and scattering method.

(2) Electrical Resistance Value at a Compression Rate of 10%

A conductive rubber component 10 was placed on a printed circuit board with a cream solder (lead-free solder paste M705-PLG-32-11, manufactured by Senju Metal Industry Co., Ltd.) pre-applied thereto and then was surface mounted using the Malcom Refolw System RDT-250C (device name, manufactured by Malcom Co., Ltd.). With respect to the heating conditions, the temperature was raised from 150° C. to 200° C. in 90 seconds for preheating and then was raised from 220° C. to 250° C. in 40 seconds for main heating. Insulator spacers were placed at both ends of the conductive rubber component thus placed on the printed circuit board and another printed circuit board was then placed thereon. Thus, the conductive rubber component was compressed by 10%. A lead was soldered to the printed circuit board and the resistance value was determined at a measuring current of 1.0 mA with a digital ohmmeter (device name; 3540 mΩ, manufactured by HiTESTER HIOKI).

Example 1

One hundred parts by weight of conductive rubber, electrical insulating silicone rubber KE530U (product name, manufactured by Shin-Etsu Chemical Co., Ltd.) was mixed with 300 parts by weight of conductive filler, a silver coated glass powder S3000 (product name, manufactured by Toshiba-Ballotini Co., Ltd.) having an average particle size of 20 μm. Then, the mixture and 7 parts by mass of curing agent RC-4 (product name, manufactured by Dow Corning Toray Silicone Co., Ltd.) containing 50% of 2,5-dimethyl-2,5-di(t-butylperoxy)hexane were mixed together homogenously. The volume resistivity of this compound was determined in accordance with ASTM D991 and was 0.07 Ω·cm. Subsequently, this compound was rolled between two rollers to a thickness of 1.2 mm.

Thereafter, the resultant compound thus rolled was placed in a mold with a pair of molding parts forming a molded space and then was heated and cured at 170° C. for 10 minutes at a pressure of 20 kg/cm². Furthermore, the molded rubber thus obtained was placed in a circulating hot air oven to be subjected to a secondary curing process at 160° C. for 8 hours. Thus, a molded sheet was produced, which was 15 cm long, 15 cm wide, and 1.0 mm thick. Subsequently, one surface of the molded sheet was subjected to sputtering processing. First, a 1-μm thick nickel inner layer was deposited on one surface of the silicone molded sheet. A 0.2-μm thick gold outer layer was deposited on the surface of the inner layer. A conductive rubber sheet with a metal coating thus formed, which was 15 cm long, 15 cm wide, and 1.0 mm thick, was fixed to a cutting panel with a double-sided tape, with the metal coating being located on the lower side. It was cut with a cutter to be 1 mm wide and 3 mm long. Thus, a conductive rubber component with a metal coating was obtained. The conductive rubber component 10 thus obtained had a shape shown in FIGS. 1A and 1C.

Next, this conductive rubber component 10 with a metal coating was placed in a carrier tape (in accordance with EIAJET standard) wound around a reel with a diameter of 180 mm to be wound up and then was picked up by an adsorber. After that, it was placed on a printed circuit board with a cream solder (manufactured by Senju Metal Industry Co., Ltd., a lead-free solder paste M705-PLG-32-11) applied thereto beforehand. Using a reflow machine, Malcom Refolw System RDT-250C (device name, manufactured by Malcom Co., Ltd.), it was reflow mounted on a gold-plated electrode (1.2 mm long and 3.2 mm wide) at a peak temperature of 250° C. FIG. 4 shows the mounted body thus obtained.

Subsequently, the conductive rubber component with a metal coating thus reflow mounted was evaluated. With this mounted body example being compressed by 10%, the resistance value was determined at a measuring current of 1.0 mA and was 0.1Ω. In the conductive rubber component with a metal coating, a nickel material that had a corrosion concern from the viewpoint of ionization tendency was used for a large part of the metal coating. However, with a gold layer provided as the surface layer, it exhibited excellent storage properties in the carrier tape for a long period of time without any corrosion caused by its ionization tendency. Furthermore, an example was produced in which the printed circuit board 9 and the electronic component 11 as shown in FIG. 5 were mounted on a portable telephone, with the conductive rubber component 10 being compressed by 20%. It was confirmed that this allowed the planar connection to be stronger and more stable.

Example 2

One hundred parts by weight of conductive rubber single body, electrical insulating silicone rubber KE530U (product name, manufactured by Shin-Etsu Chemical Co., Ltd.), was mixed with 300 parts by weight of conductive filler, a silver coated glass powder S3000 (product name, manufactured by Toshiba-Ballotini Co., Ltd.) having an average particle size of 20 μm. Then, the mixture and 7 parts by mass of curing agent RC-4 (product name, manufactured by Dow Corning Toray Silicone Co., Ltd.) containing 50 mass % of 2,5-dimethyl-2, 5-di(t-butylperoxy)hexane were mixed together homogenously.

This compound was rolled between two rollers to a thickness of 1.2 mm. Thereafter, the resultant compound thus rolled was placed in a mold with a pair of molding parts forming a molded space and then was heated and cured at 170° C. for 10 minutes at a pressure of 20 kg/cm². Furthermore, the molded rubber thus obtained was placed in a circulating hot air oven to be subjected to a secondary curing process at 160° C. for 8 hours. Thus, a molded sheet was produced, which was 15 cm long, 15 cm wide, and 1.0 mm thick. The volume resistivity of the molded rubber was determined in accordance with ASTMD991 and was 0.07 Ω·cm. Subsequently, it was subjected to sputtering processing. A 1-μm thick inner layer was deposited on one surface of the molded sheet using Monel 400 (Trademark of Inko Alloys International Inc.; Monel Alloy 400 Cu:32.3 mass %/Ni:64.5 mass %/others:3.2 mass %). Furthermore, a 0.05-μm thick gold out layer was deposited on the surface of the inner layer.

The conductive rubber sheet with a metal coating thus produced, which was 15 cm long, 15 cm wide, and 10 mm thick, was fixed to a cutting panel with a double-sided tape, with the metal coating being located on the lower side. It was cut with a cutting blade to be 1 mm wide and 3 mm long. Thus, a conductive rubber component with a metal coating was obtained. The conductive rubber component with a metal coating thus obtained was placed in a carrier tape (in accordance with EIAJET standard) wound around a reel with a diameter of 180 mm to be wound up and then was picked up by an adsorber. After that, it was placed on a printed circuit board with a cream solder (manufactured by Senju Metal Industry Co., Ltd., a lead-free solder paste M705-PLG-32-11) applied thereto beforehand. Using a reflow machine, Malcom Refolw System RDT-250C (device name, manufactured by Malcom Co., Ltd.), it was bonded onto a gold-plated electrode (1.2 mm long and 3.2 mm wide) at a peak temperature of 250° C.

Subsequently, the conductive rubber component with a metal coating thus reflow mounted was evaluated. With the conductive rubber component being solder mounted on a printed circuit board, the electrical resistance value was determined at a measuring current of 1.0 mA, with the mounted body example being compressed by 10%, and was 0.1Ω. Furthermore, an example was produced, in which the printed circuit board 9 and the electronic component 11 as shown in FIG. 5 were mounted on a portable telephone, with the conductive rubber component 10 being compressed by 20%. It was confirmed that this allowed the planar connection to be stronger and more stable.

INDUSTRIAL APPLICABILITY

The conductive rubber components of the present invention can be applied to electronic components for portable telephones, personal computers, electronic dictionaries, navigators, calculators, portable game devices, etc.

The invention claimed is:

1. A conductive rubber component, comprising:
   a conductive rubber single body, which is a single layer body; and
   a metal coating formed directly on at least one surface of the conductive rubber single body, which is subjected to compression when the conductive rubber component is mounted, by at least one method selected from the group consisting of atomic deposition and molecular deposition,
   wherein the conductive rubber component is capable of being surface mounted and soldered,
   the metal coating is formed of two or more layers, and
   an outermost layer of the metal coating comprises gold.

2. The conductive rubber component according to claim 1, wherein the metal coating has a thickness in a range from 0.05 μm to 4 μm.

3. The conductive rubber component according to claim 1, wherein the metal coating is formed by sputtering.

4. The conductive rubber component according to claim 1, wherein an inner layer of the two or more layers forming the metal coating is made of at least one metal selected from the group consisting of platinum, silver, titanium, aluminum, palladium, copper, and nickel, and an alloy thereof.

5. The conductive rubber component according to claim 1, wherein the outermost layer of the metal coating has a thickness in a range from 0.005 μm to 1 μm.

6. The conductive rubber component according to claim 1, wherein the conductive rubber single body comprises a conductive filler in an amount range from 60 to 600 mass % mixed relative to 100 mass % of rubber in the conductive rubber single body.

7. The conductive rubber component according to claim 1, wherein the conductive rubber single body has an electrical resistance between $10^{-5}$ Ω·cm and 10 kΩ·cm in terms of volume resistance.

8. The conductive rubber component according to claim 1, wherein the conductive rubber single body comprises a radical reaction curable silicone rubber.

9. The conductive rubber component according to claim 1, wherein the conductive rubber component is packed in a carrier tape comprising a recess.

10. A method for mounting a conductive rubber component, the method comprising:
    surface mounting a conductive rubber component on a printed circuit board; and
    fixing the conductive rubber component on the printed circuit board by soldering so as to be incorporated in the printed circuit board,
    wherein the mounted conductive rubber component electrically connects the printed circuit board with an electronic component each other, and
    wherein the conductive rubber component comprises:
      a conductive rubber single body, which is a single layer body; and
      a metal coating formed directly on at least one surface of the conductive rubber single body, which is subjected to compression when the conductive rubber component is mounted, by at least one method selected from the group consisting of atomic deposition and molecular deposition,
    the metal coating is formed of two or more layers, and
    an outer most layer of the metal coating comprises gold.

11. The method for mounting a conductive rubber component according to claim 10, wherein the conductive rubber component is attached to the printed circuit board by the surface mounting step using an adsorber and solder reflow.

12. The method for mounting a conductive rubber component according to claim 10,
    wherein the conductive rubber components are accommodated in a carrier tape comprising recesses and feed holes provided at a selected interval, and
    the conductive rubber component is mounted so as to electrically connect the printed circuit board and an electrode part of the electronic component each other.

13. The method for mounting a conductive rubber component according to claim 10, wherein the printed circuit board and the electronic component are mounted, with the conductive rubber component being compressed by volume in a range from 10 to 50%.

14. The method for mounting a conductive rubber component according to claim 10, wherein the metal coating has a thickness in a range from 0.05 μm to 4 μm.

15. The method for mounting a conductive rubber component according to claim 10, wherein the metal coating is formed by sputtering.

16. The method for mounting a conductive rubber component according to claim 10, wherein an inner layer of the two or more layers forming the metal coating is made of at least one metal selected from the group consisting of platinum, silver, titanium, aluminum, palladium, copper, and nickel, and an alloy thereof.

17. The method for mounting a conductive rubber component according to claim 10, wherein the outermost layer of the metal coating has a thickness in a range from 0.005 μm to 1 μm.

* * * * *